United States Patent
Cheng et al.

(10) Patent No.: US 9,469,524 B2
(45) Date of Patent: *Oct. 18, 2016

(54) SEMICONDUCTOR DEVICE WITH THROUGH MOLDING VIAS AND METHOD OF MAKING THE SAME

(71) Applicant: TAIWAN SEMICONDUCTOR MANUFACTURING COMPANY, LTD., Hsinchu (TW)

(72) Inventors: Chun-wen Cheng, Zhubei (TW); Jung-Huei Peng, Jhubei (TW); Shang-Ying Tsai, Pingzhen (TW); Hung-Chia Tsai, Taichung (TW); Yi-Chuan Teng, Zhubei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/851,086

(22) Filed: Sep. 11, 2015

(65) Prior Publication Data
US 2016/0002027 A1 Jan. 7, 2016

Related U.S. Application Data

(63) Continuation of application No. 14/107,034, filed on Dec. 16, 2013, now Pat. No. 9,150,404.

(51) Int. Cl.
*H01L 21/302* (2006.01)
*B81B 7/00* (2006.01)
(Continued)

(52) U.S. Cl.
CPC .............. *B81B 7/007* (2013.01); *B81B 7/02* (2013.01); *B81C 1/00301* (2013.01);
(Continued)

(58) Field of Classification Search
CPC . B81B 7/007; B81C 1/00301; H01L 21/311;
H01L 21/8238; H01L 21/76224; H01L 21/76205; H01L 21/76831; H01L 21/28079;
H01L 21/762; H01L 21/3105; H01L 21/0245;
H01L 21/56; H01L 21/2007; H01L 23/4951;
H01L 23/3157; H01L 23/4952; H01L 23/488;
H01L 23/3114
USPC .............. 438/700, 270, 106, 127, 199, 692;
257/E21.006, E21.126, E21.127,
257/E21.304, E21.435, E21.499, E21.509,
257/E21.545
See application file for complete search history.

(56) References Cited

U.S. PATENT DOCUMENTS 6,249,824 B1 6/2001 Henrichs
8,941,152 B1 1/2015 Cheng et al.
(Continued)

*Primary Examiner* — David Nhu
(74) *Attorney, Agent, or Firm* — Hauptman Ham, LLP

(57) ABSTRACT

A method of forming a semiconductor device includes bonding a capping wafer and a base wafer to form a wafer package. The base wafer includes a first chip package portion, a second chip package portion, and a third chip package portion. The capping wafer includes a plurality of isolation trenches. Each isolation trench of the plurality of isolation trenches is substantially aligned with a corresponding trench region of one of the first chip package portion, the second chip package portion or the third chip package portion. The method also includes removing a portion of the capping wafer to expose a first chip package portion contact, a second chip package portion contact, and a third chip package portion contact. The method further includes separating the wafer package into a first chip package configured to perform a first operation, a second chip package configured to perform a second operation, and a third chip package configured to perform a third operation.

20 Claims, 5 Drawing Sheets

(51) Int. Cl.
  *B81C 1/00* (2006.01)
  *B81B 7/02* (2006.01)
  *H01L 23/00* (2006.01)
  *H01L 21/56* (2006.01)

(52) U.S. Cl.
  CPC .............. *H01L 24/19* (2013.01); *H01L 24/97* (2013.01); *B81B 2201/0235* (2013.01); *B81B 2201/0242* (2013.01); *B81B 2201/0264* (2013.01); *B81B 2207/07* (2013.01); *B81B 2207/094* (2013.01); *B81B 2207/095* (2013.01); *B81C 2203/0154* (2013.01); *B81C 2203/0771* (2013.01); *H01L 21/568* (2013.01); *H01L 2224/12105* (2013.01); *H01L 2224/73267* (2013.01); *H01L 2924/18162* (2013.01)

(56) References Cited

U.S. PATENT DOCUMENTS

| | | | |
|---|---|---|---|
| 9,150,404 | B2 * | 10/2015 | Cheng ...................... B81B 7/02 |
| 2003/0157426 | A1 | 8/2003 | Jordan et al. |
| 2013/0307105 | A1 | 11/2013 | Hsu |

* cited by examiner

SEMICONDUCTOR DEVICE WITH THROUGH MOLDING VIAS AND METHOD OF MAKING THE SAME

PRIORITY CLAIM

The present application is a continuation of U.S. application Ser. No. 14/107,034, filed Dec. 16, 2013, now U.S. Pat. No. 9,150,404, which is incorporated herein by reference in its entirety.

BACKGROUND

Device manufacturers are continually challenged to deliver value and convenience to consumers by, for example, providing integrated circuits that provide quality performance. Some integrated circuits include multiple microelectromechanical systems or chip packages formed by different processes. These types of integrated circuits often fail, because the chip packages are not formed under common conditions, and one chip package's operational performance is unknown compared to another chip package's operational performance.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion. In accordance with one or more embodiments, the figures of the accompanying drawings which are incorporated herein comprise the following.

DETAILED DESCRIPTION

The following disclosure provides many different embodiments, or examples, for implementing different features of the invention. Specific examples of components and arrangements are described below to simplify the present disclosure. These are examples and are not intended to be limiting.

Some semiconductor devices combine multiple chip packages into an integrated circuit. These semiconductor devices often fail, because of difficulty in determining whether a chip package is capable of performing an intended operation or the chip package is defective. As such, some devices that are capable of performing an intended operation are joined with defective devices causing the integrated circuit to fail. Using devices that are known to be capable of performing an intended operation reduces the likelihood that a final semiconductor device will be defective. Controlling the source of all of the chip packages used in a semiconductor device increases the likelihood that all of the chip packages used in the semiconductor device are known to be able to perform an intended operation. Additionally, common integrated circuits use through silicon vias to facilitate electrical connectivity to one or more chip packages that are components of an integrated circuit. Through silicon vias, however, are costly to produce.

Figure 1:
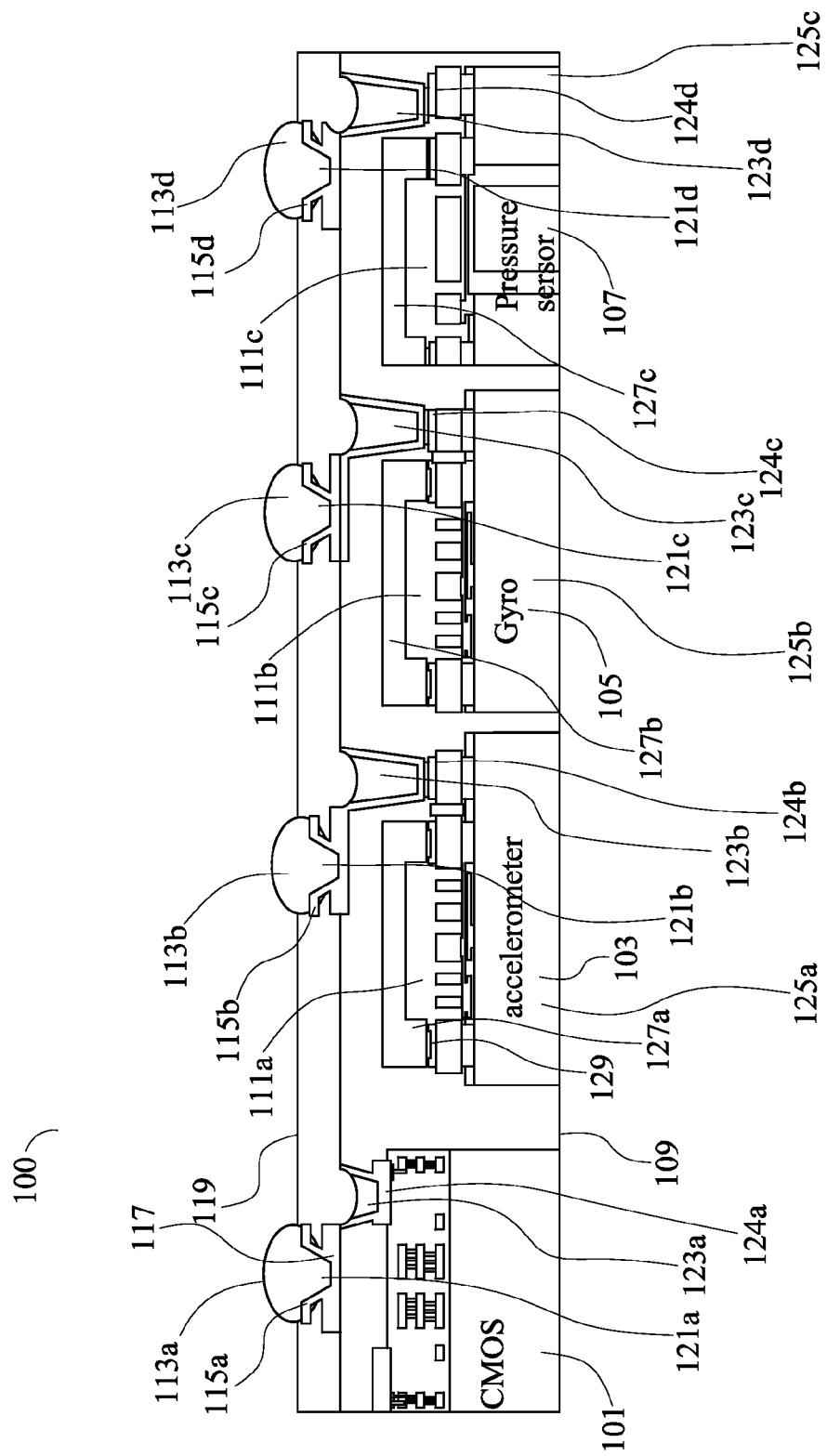
FIG. 1 is a cross sectional view of a semiconductor device having through molding vias, in accordance with one or more embodiments.

FIG. 1 is a cross sectional view of a semiconductor device 100 having through molding vias, in accordance with one or more embodiments. The semiconductor device 100 comprises a CMOS chip package 101, a first chip package 103, a second chip package 105, and a third chip package 107 bonded together by a molding compound 109. The first chip package 103, second chip package 105, and third chip package 107 includes isolation trenches 111a-111c therein.

The semiconductor device 100 also comprises a plurality of conductive elements 113a-113d that are over and in contact with a series of under bump layers 115a-115d. The under bump layers 115a-115d are over and in contact with a redistribution layer 117. The conductive elements 113 and under bump layers 115 are formed within a plurality of openings 121a-121d in an insulation layer 119. The insulation layer 119, in some embodiments, comprises an epoxy or low outgassing material. The semiconductor device 100 also includes a plurality of through molding vias 123a-123d that are lined by the redistribution layer 117 and optionally sealed by the insulation layer 119. The through molding vias 123a-123d facilitate electrical connection with, for example, contacts 124a-124d (collectively referred to as contact 124) of the CMOS chip package 101, the first chip package 103, the second chip package 105 and the third chip package 107.

The first chip package 103, second chip package 105, and third chip package 107 comprise a chip package portion 125 of a series of corresponding chip package portions 125a-125c (collectively referred to as chip package portion 125) that are each derived from a same base wafer. The first chip package 103, second chip package 105, and third chip package 107 also comprise a capping wafer portion 127 of a series of corresponding capping wafer portions 127a-127c (collectively referred to as capping wafer portion 127). The capping wafer portions 127a-127c are eutectic bonded by a eutectic bond 129 to the chip package portions 125. The capping wafer portions 127a-127c are each derived from a same capping wafer.

The capping wafer and the base wafer are eutectic bonded by eutectic bond 129 to form a wafer package. The wafer package is thereafter separable into he first chip package 103, second chip package 105, and third chip package 107 by, for example, a die cutting process or any other process suitable for separating the wafer package into separate chip packages.

In some embodiments, the first chip package 103, second chip package 105 and third chip package 107 are configured to perform specific operations. For example, in some embodiments, the first chip package 103 is an accelerometer, the second chip package 105 is a gyroscope, and the third chip package 107 is a pressure sensor. In some embodiments, the semiconductor device 100 comprises one or more types of chip packages that are one or more of application specific integrated circuits (ASIC), a high vacuum pressure devices (such as devices having 3 ATM pressure), or low vacuum pressure devices. In some embodiments, some of the first chip package 103, the second chip package 105, and the third chip package 107 are configured to be capable of performing the some of the same or various different operations.

Figure 2:
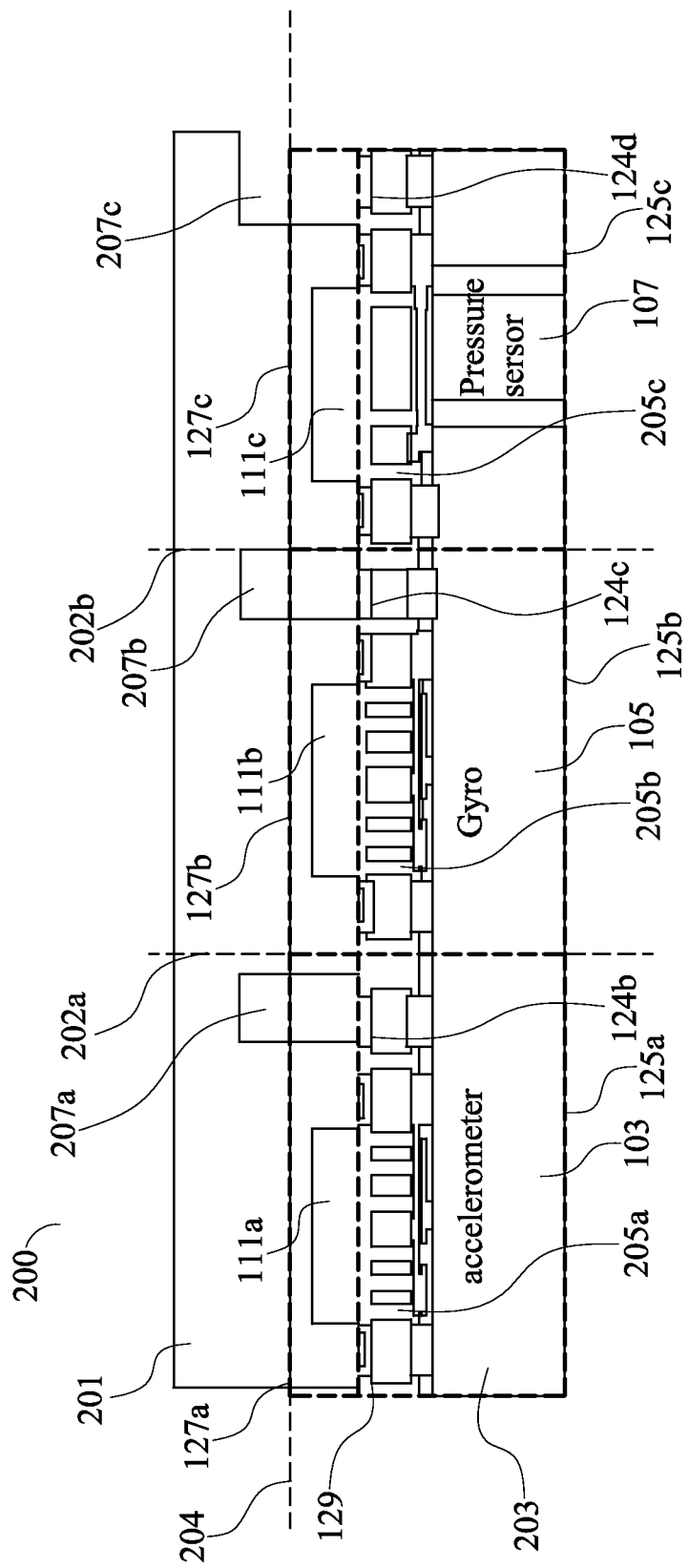
FIG. 2 is a cross sectional view of a wafer package, in accordance with one or more embodiments.

FIG. 2 is a cross sectional view of a wafer package 200, in accordance with one or more embodiments. The wafer package 200 includes a capping wafer 201 eutectic bonded to a base wafer 203. The capping wafer 201 includes capping wafer portions 127a-127c and chip package portions 125a-125c before being separated by, for example, a die cutting process or other separation process along lines 202a and 202b. The eutectic bonds 129 are formed between the capping wafer 201 and the base wafer 203 before the separation process. Accordingly, each of the resulting chip packages 103, 105 and 107 are formed from the same capping wafer 201, the same base wafer 203, and are subjected to the same eutectic bonding process that forms eutectic bonds 129.

In some embodiments, the eutectic bonds 129 comprise aluminum, germanium, indium, gold, tin, silicon, tungsten, carbon, other suitable materials, or a combination thereof. In some embodiments, one or more materials that are part of eutectic bonds 129 are deposited on one or more of the capping wafer 201 or the base wafer 203 before the eutectic bonds 129 are formed.

The capping wafer package 201 comprises the isolation trenches 111a-111c and separation trenches 207a-207c. The isolation trenches 111a-111c and the separation trenches 207a-207c have differing depths with respect to a same surface of the capping wafer 201. The separation trenches 207a-207c are configured to substantially align with contacts 124b-124d. The contacts 124, for example comprise aluminum, copper, gold, tin, other suitable materials, or any combination thereof. The separation trenches 207a-207c are formed by any process capable of removing material from a substrate such as, but not limited to, an etching process, in the capping wafer 201 before the capping wafer 201 is eutectic bonded to the base wafer 203.

The isolation trenches 111a-111c of the capping wafer 201 align with corresponding trenches 205a-205c of the chip package portions 125. The isolation trenches 111a-111c are formed by any process capable of removing material from a substrate such as, but not limited to, an etching process, in the capping wafer 201 before the capping wafer 201 is eutectic bonded to the base wafer 203.

After the capping wafer 201 is eutectic bonded to the base wafer 203, the capping wafer 201 is thinned or leveled, in some embodiments, by a grinding or CMP process, for example, along line 204 to remove portions of the capping wafer 201 thereby separating the capping wafer portions 127a, 127b and 127c and rendering contacts 124 exposed.

Figure 3:
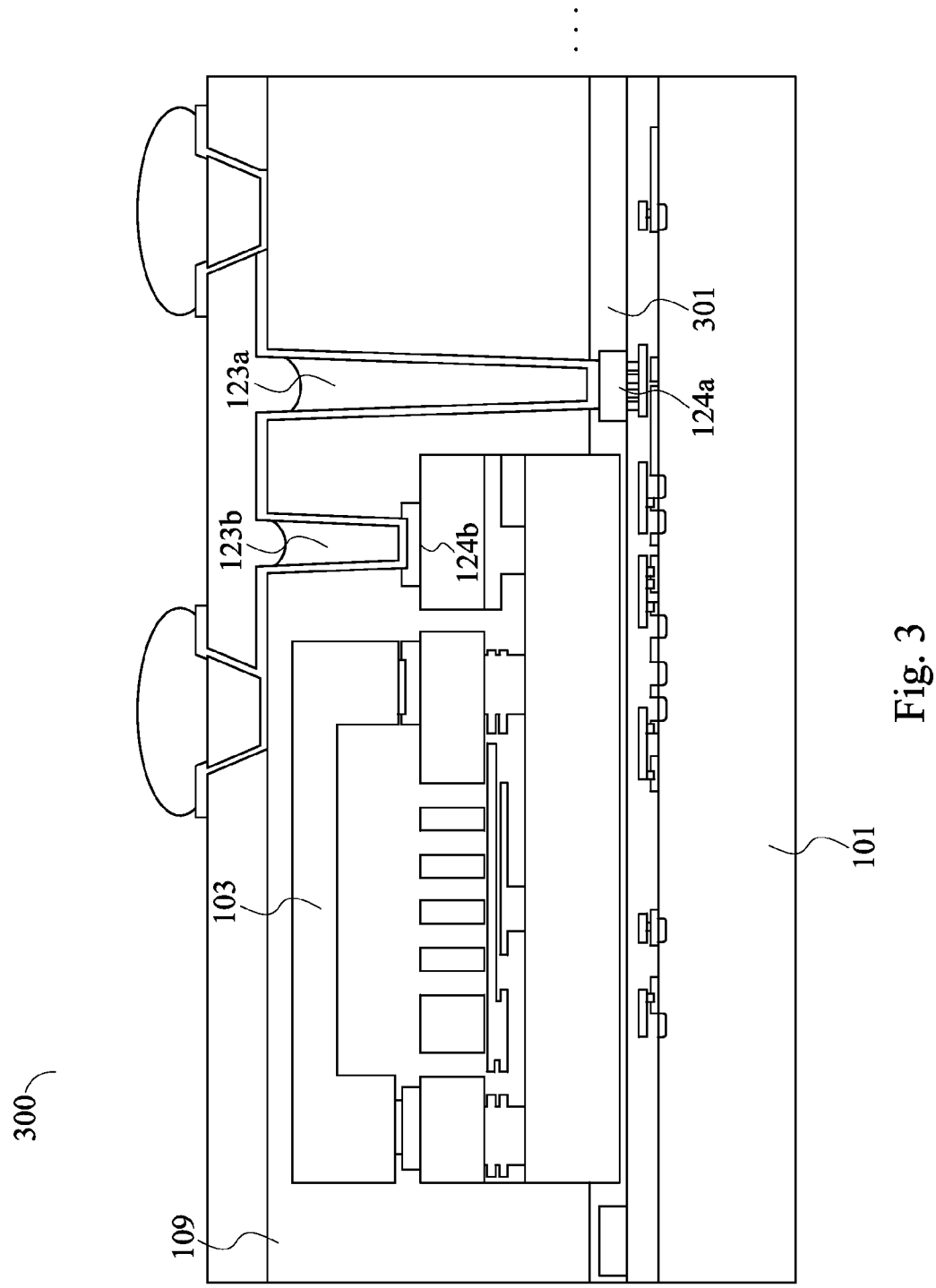
FIG. 3 is a cross sectional view of a wafer package, in accordance with one or more embodiments.

FIG. 3 is a close-up cross sectional view of a semiconductor device 300 having through molding vias 123a-123b and a base CMOS chip package 101, in accordance with one or more embodiments. FIG. 3 illustrates many of the features discussed with respect to FIGS. 1 and 2. FIG. 3 illustrates first chip package 103 bonded to the CMOS chip package 101 as opposed to beside the CMOS chip package 101 as illustrated in FIG. 1. The CMOS chip package 101, in this example embodiment, serves as a carrier or substrate upon which the first chip package 103, the second chip package 105 (not shown, see FIG. 1), and the third chip package 107 (not shown, see FIG. 1) are placed. The molding compound 109 encapsulates the first chip package 103, second chip package 105, and third chip package 107 with respect to the CMOS chip package 101, and bonds the first chip package 103, second chip package 105 and third chip package 107 together. The semiconductor device 300 optionally includes an epoxy layer 301 that one of bonds the first chip package 103, second chip package 105 and third chip package 107 to the CMOS chip package 101, or is provided as an insulator on the CMOS chip package 101 before placing the first chip package 103, second chip package 105, and third chip package 107 thereon. If the epoxy layer 301 is applied and cured, for example, before the first chip package 103, second chip package 105, and third chip package 107 are placed on the CMOS chip package 101, then the chip packages 103, 105 and 107 are bonded to the CMOS chip package 101 by the molding compound.

The semiconductor device 300 includes through molding vias 123a-123d (123c-123d not shown, see FIG. 1) that expose contacts 124a-124d (124c-124d not shown, see FIG. 1), for example, to facilitate electrical connectivity to the first chip package 103, second chip package 105, third chip package 107 and CMOS chip package 101.

Figure 4:
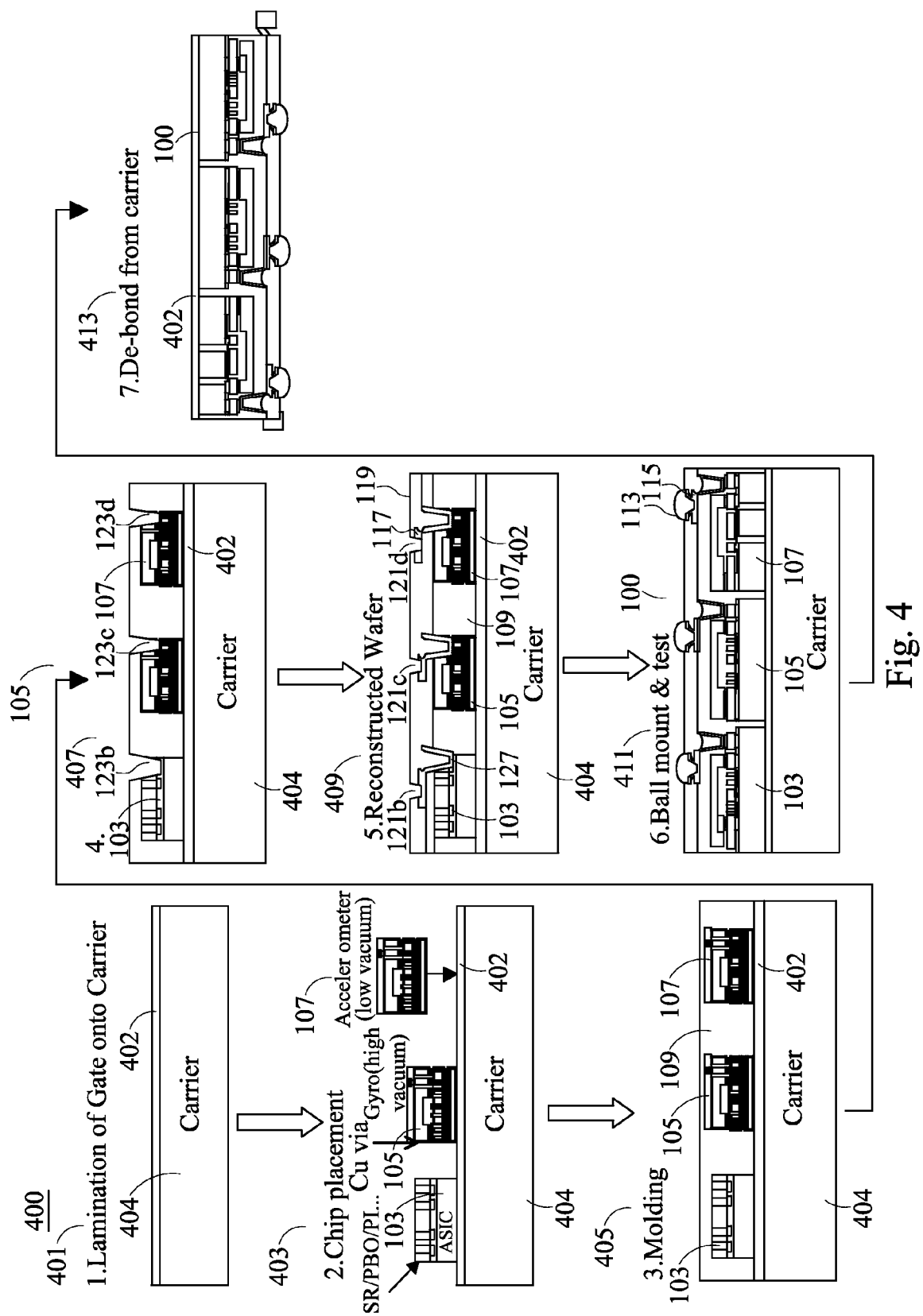
FIG. 4 is a flowchart of a process of making a semiconductor device, in accordance with one or more embodiments.

FIG. 4 is a flowchart of a process 400 for making a semiconductor device such as semiconductor device 100, in accordance with one or more embodiments. The process begins with step 401 in which an adhesive material 402 is placed on a carrier 404. Then, in step 403, chip packages 103, 105 and 107 are placed on the carrier 404. Next, in step 405, the molding compound 109 is deposited over the first chip package 103, the second chip package 105 and the third chip package 107. The molding compound 109 is also cured. In step 407, the molding compound 109 is optionally leveled by, for example, a grinding or CMP process, and the plurality of through molding vias 123b-123d are formed exposing the contacts 124b-124d (FIG. 1).

Then, in step 409, a reconstructed wafer is formed by forming the redistribution layer 117 over the chip packages 103, 105, 107, and in the through molding vias 123b-123d. The insulation layer 119 is also formed over the first chip package 103, the second chip package 105, and the third chip package 107, optionally sealing the through molding vias 123b-123d. The insulation layer 119 is optionally cured if the insulation layer 119 comprises a material that requires curing. The insulation layer 119 is also optionally leveled by, for example, a grinding or CMP process. The plurality of openings 121b-121d are formed in the insulation layer 119 exposing the redistribution layer 117, for example, by an etching process or other suitable process for removing material.

In step 411, a plurality of conductive elements 113, such as solder balls, are deposited in the plurality of openings 121. In some embodiments, the plurality of conductive elements alternatively comprise a plurality of conductive pillars. The semiconductor device 100 is then tested for one or more functions associated with the semiconductor device 100 and/or any operations associated with each of the chip packages 103, 105, or 107. In some embodiments, the under bumper layers 115 are optionally deposited in the openings 121 before depositing the conductive elements in the openings 121. Then, in step 413, the carrier 404 is optionally removed from the semiconductor device 100 by, for example, de-bonding the adhesive 402. If, for example, the carrier 404 is a CMOS chip package 101, the carrier 404 remains as a portion of the semiconductor device 100.

Figure 5:
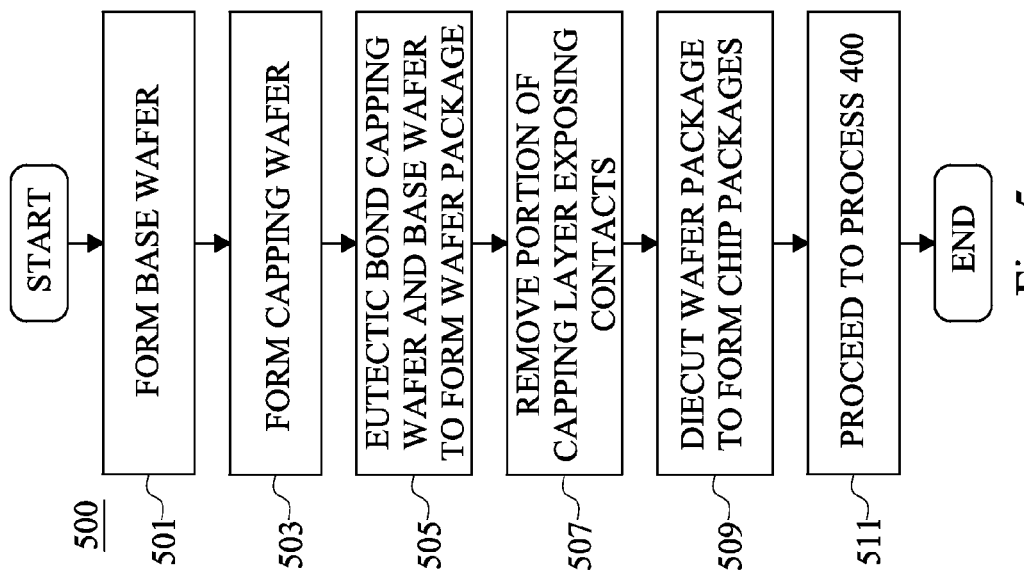
FIG. 5 is a flowchart of a process of making a semiconductor device, in accordance with one or more embodiments.

FIG. 5 is a flow chart of a method 500 of making a semiconductor device 100, in accordance with one or more embodiments. Method 500 begins with step 501 in which a base wafer comprising a first chip package portion, a second chip package portion, and a third chip package portion is formed by one or more of deposition, etching, photolithographic processes, or other suitable process, or combination of processes, in or on a substrate.

Then, in step 503, a capping wafer is formed comprising a plurality of isolation trenches, the plurality of isolation trenches being configured to substantially align with one of the first chip package portion, the second chip package portion or the third chip package portion. The capping wafer also comprises a plurality of separation trenches having a depth greater than the isolation trenches with respect to a same surface of the capping wafer. The capping wafer is formed by one or more of deposition, etching, photolithographic processes, or other suitable process, or combination of processes, in or on a substrate.

In step 505, the capping wafer is eutectic bonded to the base wafer to form a wafer package. In some embodiments, the communication openings are formed in the capping wafer before the capping wafer is eutectic bonded to the base wafer. In other embodiments, the communication openings are formed after the capping wafer is eutectic bonded to the base wafer.

In step 507, a portion of the capping wafer is removed to expose a first chip package portion contact, a second chip package portion contact, and a third chip package portion contact, the first chip package portion contact, the second chip package portion contact and the third chip package portion contact are substantially aligned with a corresponding separation trench. In some embodiments, the portion of the capping wafer that is removed is subjected to a grinding process or a CMP process, for example.

In step 509, wafer package is separated by, for example a die cutting process or other suitable process for separating a wafer package into multiple portions, to separate the wafer package into a first chip package configured to perform a first operation, the first chip package comprising the first chip package portion, a second chip package configured to perform a second operation, the second chip package comprising the second chip package portion, and a third chip package configured to perform a third operation, the third chip package comprising the third chip package portion. In some embodiments, the plurality of communication openings are formed in the capping wafer before the wafer package is separated. In other embodiments, the plurality of communication openings is formed in the capping wafer and any portions thereof after the separation process.

In step 511, the process continues to process 400, discussed with respect to FIG. 4. In some embodiments, a CMOS chip package portion is placed on the carrier 404 (FIG. 4) before bonding the first chip package, the second chip package and third chip package. Accordingly, the CMOS chip package, the first chip package, the second chip package and the third chip package are bonded together using the molding compound. Additionally, a corresponding through molding via is formed to facilitate electrical connectivity with the CMOS chip package and the redistribution layer 117 (FIG. 1) is formed over the CMOS chip package and in the through molding via that corresponds with the CMOS chip package.

An aspect of this description is related to a method of forming a semiconductor device. The method comprises bonding a capping wafer and a base wafer to form a wafer package. The base wafer comprises a first chip package portion, a second chip package portion, and a third chip package portion. The capping wafer comprises a plurality of isolation trenches. Each isolation trench of the plurality of isolation trenches is substantially aligned with a corresponding trench region of one of the first chip package portion, the second chip package portion or the third chip package portion. The method also comprises removing a portion of the capping wafer to expose a first chip package portion contact, a second chip package portion contact, and a third chip package portion contact. The method further comprises separating the wafer package into a first chip package configured to perform a first operation, a second chip package configured to perform a second operation, and a third chip package configured to perform a third operation.

Another aspect of this description is related to a semiconductor device. The semiconductor device comprises a first chip package configured to perform a first operation. The first chip package comprises a first chip package portion comprising a first base wafer portion of a base wafer and a first capping wafer portion of a capping wafer. The first capping wafer portion is bonded to the first base wafer portion. The semiconductor device also comprises a second chip package configured to perform a second operation. The second chip package comprises a second chip package portion comprising a second base wafer portion of the base wafer and a second capping wafer portion of the capping wafer. The second capping wafer portion is bonded to the second base wafer portion. The semiconductor device further comprises a third chip package configured to perform a third operation. The third chip package comprises a third chip package portion comprising a third base wafer portion of the base wafer and a third capping wafer portion of the capping wafer. The third capping wafer portion is bonded to the third base wafer portion. The semiconductor device additionally comprises a molding compound layer over the first chip package, the second chip package, and the third chip package. The molding compound layer has a plurality of through molding vias therein exposing a first chip package portion contact, a second chip package portion contact, and a third chip package portion contact.

A further aspect of this description is related to a semiconductor device. The semiconductor device comprises a first chip package configured to perform a first operation. The first chip package comprises a first chip package portion comprising a first base wafer portion of a base wafer and a first capping wafer portion of a capping wafer. The first capping wafer portion is bonded to the first base wafer portion. The semiconductor device also comprises a second chip package configured to perform a second operation. The second chip package comprises a second chip package portion comprising a second base wafer portion of the base and a second capping wafer portion of the capping wafer. The second capping wafer portion is bonded to the second base wafer portion. The semiconductor device further comprises a third chip package configured to perform a third operation. The third chip package comprises a third chip package portion comprising a third base wafer portion of the base wafer and a third capping wafer portion of the capping wafer. The third capping wafer portion is bonded to the third base wafer portion. The semiconductor device additionally comprises a CMOS chip package bonded to the first chip package, the second chip package, and the third chip package.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. Although features of various embodiments are expressed in certain combinations among the claims, it is contemplated that these features can be arranged in any combination and order. It is therefore intended that the protection granted hereon be limited only by the definition contained in the appended claims and equivalents thereof.

What is claimed is:

1. A method of forming a semiconductor device, the method comprising:
   bonding a capping wafer and a base wafer to form a wafer package,
   wherein
      the base wafer comprises a first chip package portion, a second chip package portion, and a third chip package portion, and
      the capping wafer comprises a plurality of isolation trenches, each isolation trench of the plurality of isolation trenches is substantially aligned with a corresponding trench region of one of the first chip package portion, the second chip package portion or the third chip package portion;
   removing a portion of the capping wafer to expose a first chip package portion contact, a second chip package portion contact, and a third chip package portion contact; and
   separating the wafer package into a first chip package configured to perform a first operation, a second chip package configured to perform a second operation, and a third chip package configured to perform a third operation.

2. The method of claim 1, further comprising:
   bonding the first chip package, the second chip package, and the third chip package together with a molding compound.

3. The method of claim 2, further comprising:
   forming a plurality of through molding vias through the molding compound exposing the first chip package portion contact, the second chip package portion contact, and the third chip package portion contact;
   forming a redistribution layer over the first chip package, the second chip package, and the third chip package, at least a portion of the molding compound, and in the plurality of through molding vias.

4. The method of claim 3, further comprising:
   forming an insulation layer over the molding compound and the redistribution layer; and
   forming a plurality of openings in the insulation layer exposing at least a portion of the redistribution layer.

5. The method of claim 4, further comprising:
   forming a plurality of under bump layers in the plurality of openings; and
   forming a plurality of solder bumps over the under bump layers.

6. The method of claim 1, wherein at least one of the first chip package, the second chip package or the third chip package is an accelerometer, a gyroscope, or a pressure sensor.

7. The method of claim 1, further comprising:
   placing an adhesive layer on a substrate; and
   placing the first chip package, the second chip package and the third chip package over the adhesive layer;
   bonding the first chip package, the second chip package and the third chip package together; and
   removing the substrate by de-bonding the adhesive from the bonded first chip package, second chip package and third chip package.

8. A semiconductor device comprising:
   a first chip package configured to perform a first operation, the first chip package comprising a first chip package portion comprising:
      a first base wafer portion of a base wafer; and
      a first capping wafer portion of a capping wafer, the first capping wafer portion being bonded to the first base wafer portion;
   a second chip package configured to perform a second operation, the second chip package comprising a second chip package portion comprising:
      a second base wafer portion of the base wafer; and
      a second capping wafer portion of the capping wafer, the second capping wafer portion being bonded to the second base wafer portion;
   a third chip package configured to perform a third operation, the third chip package comprising a third chip package portion comprising:
      a third base wafer portion of the base wafer; and
      a third capping wafer portion of the capping wafer, the third capping wafer portion being bonded to the third base wafer portion; and
   a molding compound layer over the first chip package, the second chip package, and the third chip package, the molding compound layer having a plurality of through molding vias therein exposing a first chip package portion contact, a second chip package portion contact, and a third chip package portion contact.

9. The semiconductor device of claim 8, wherein at least one of the first chip package, the second chip package or the third chip package is an accelerometer, a gyroscope, or a pressure sensor.

10. The semiconductor device of claim 8, wherein at least one of the first chip package, the second chip package or the third chip package is an application specific integrated circuit (ASIC).

11. The semiconductor device of claim 8, further comprising:
   a redistribution layer over the first chip package, the second chip package, and the third chip package, and in the plurality of through molding vias;
   an insulation layer over the molding compound;
   a plurality of openings in the insulation layer exposing the redistribution layer; and
   a plurality of conductive elements in the plurality of openings.

12. The semiconductor device of claim 11, wherein the conductive elements comprise an under bump layer and a solder bump.

13. The semiconductor device of claim 11, wherein the conductive elements comprise a conductive pillar.

14. The semiconductor device of claim 11, wherein each molding via of the plurality of through molding vias is sealed by the insulation layer.

15. A semiconductor device comprising:
   a first chip package configured to perform a first operation, the first chip package comprising a first chip package portion comprising:
      a first base wafer portion of a base wafer; and
      a first capping wafer portion of a capping wafer, the first capping wafer portion being bonded to the first base wafer portion;
   a second chip package configured to perform a second operation, the second chip package comprising a second chip package portion comprising:
      a second base wafer portion of the base wafer; and
      a second capping wafer portion of the capping wafer, the second capping wafer portion being bonded to the second base wafer portion;

a third chip package configured to perform a third operation, the third chip package comprising a third chip package portion comprising:
  a third base wafer portion of the base wafer; and
  a third capping wafer portion of the capping wafer, the third capping wafer portion being bonded to the third base wafer portion;
a CMOS chip package bonded to the first chip package, the second chip package, and the third chip package.

16. The semiconductor device of claim 15, wherein at least one of the first chip package, the second chip package or the third chip package is an accelerometer, a gyroscope, or a pressure sensor.

17. The semiconductor device of claim 15, further comprising:
  a redistribution layer over the first chip package, the second chip package, and the third chip package, and in electrical contact with the first chip package, the second chip package, and the third chip package;
  an insulation layer over the redistribution layer, the insulation layer having a plurality of openings defined therein exposing the redistribution layer; and
  a conductive element in each opening of the plurality of openings.

18. The semiconductor device of claim 15, wherein at least one of the first chip package, the second chip package, or the third chip package is over the CMOS chip package.

19. The semiconductor device of claim 18, further comprising:
  a redistribution layer over the first chip package, the second chip package, and the third chip package, and in electrical contact with the first chip package, the second chip package, the third chip package and the CMOS chip package.

20. The semiconductor device of claim 15, wherein at least two of the first chip package, the second chip package, the third chip package, and the CMOS chip package are bonded together by a molding compound.

* * * * *